(12) United States Patent
Chan Arguedas et al.

(10) Patent No.: US 12,062,592 B2
(45) Date of Patent: Aug. 13, 2024

(54) INTEGRATED CIRCUIT PACKAGES WITH THERMAL INTERFACE MATERIALS WITH DIFFERENT MATERIAL COMPOSITIONS

(71) Applicant: Intel Corporation, Santa Clara, CA (US)

(72) Inventors: Sergio Antonio Chan Arguedas, Chandler, AZ (US); Amitesh Saha, Phoenix, AZ (US); Marco Aurelio Cartas, Chandler, AZ (US); Ken Hackenberg, Plano, TX (US); Emilio Tarango Valles, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1299 days.

(21) Appl. No.: 16/419,827

(22) Filed: May 22, 2019

(65) Prior Publication Data

US 2020/0373220 A1 Nov. 26, 2020

(51) Int. Cl.
*H01L 23/42* (2006.01)
*H01L 23/373* (2006.01)
(Continued)

(52) U.S. Cl.
CPC .......... *H01L 23/42* (2013.01); *H01L 23/3736* (2013.01); *H01L 23/538* (2013.01);
(Continued)

(58) Field of Classification Search
CPC ... H01L 23/42; H01L 23/3736; H01L 23/538; H01L 24/09; H01L 24/17; H01L 24/29; H01L 24/32; H01L 25/0655; H01L 25/072; H01L 2224/04026; H01L 2224/05528; H01L 2224/131; H01L 2224/29012; H01L 2224/05647; H01L 2224/32245; H01L 2224/16238; H01L 2224/29076; H01L 2224/29078; H01L 2224/16157; H01L 2224/16227; H01L 23/3675; H01L 23/433; H01L 23/5385; H01L 2224/05568; H01L 2224/29109; H01L 2224/29111; H01L 2224/29124; H01L 2224/29139; H01L 2224/29144; H01L 2224/29155; H01L 2224/32503; H01L 2224/73204;
(Continued)

(56) References Cited

U.S. PATENT DOCUMENTS

| | | | |
|---|---|---|---|
| 5,789,810 A * | 8/1998 | Gross | H01L 21/563 257/710 |
| 11,081,449 B2 * | 8/2021 | Hamaguchi | H05K 7/20 |

(Continued)

*Primary Examiner* — Ida M Soward
(74) *Attorney, Agent, or Firm* — Akona IP PC

(57) ABSTRACT

Disclosed herein are integrated circuit (IC) packages with thermal interface materials (TIMs) with different material compositions, as well as related methods and devices. For example, in some embodiments, an IC package may include a package substrate, a die, and TIM, wherein the die is between the TIM and the package substrate along a vertical axis. The TIM may include a first TIM having a first material composition and a second TIM having a second material composition; the first material composition may be different than the second material composition, and the first TIM and the second TIM may be in different locations along a lateral axis perpendicular to the vertical axis.

30 Claims, 4 Drawing Sheets

(51) Int. Cl.
　　　*H01L 23/00*　　　(2006.01)
　　　*H01L 23/538*　　(2006.01)
　　　*H01L 25/065*　　(2023.01)
　　　*H01L 25/07*　　　(2006.01)
(52) U.S. Cl.
　　　CPC .............. *H01L 24/09* (2013.01); *H01L 24/17* (2013.01); *H01L 25/0655* (2013.01); *H01L 25/072* (2013.01); *H01L 2224/16157* (2013.01); *H01L 2224/16227* (2013.01)
(58) Field of Classification Search
　　　CPC ... H01L 2224/73253; H01L 2224/2919; H01L 2924/15311; H01L 2924/16151; H01L 2924/16153; H01L 2924/16235; H01L 2924/16251
　　　See application file for complete search history.

(56) References Cited

U.S. PATENT DOCUMENTS

| | | | | |
|---|---|---|---|---|
| 11,088,109 | B2* | 8/2021 | Lin | H01L 23/3677 |
| 2002/0084532 | A1* | 7/2002 | Neogi | H01L 21/50 |
| | | | | 257/796 |
| 2004/0075076 | A1* | 4/2004 | Bhagwagar | C08L 83/04 |
| | | | | 252/70 |
| 2004/0164402 | A1* | 8/2004 | Yoshimura | H01L 24/32 |
| | | | | 257/E23.09 |
| 2005/0280128 | A1* | 12/2005 | Mok | H01L 23/427 |
| | | | | 257/E23.088 |
| 2006/0060952 | A1* | 3/2006 | Yuan | H01L 23/4334 |
| | | | | 257/E23.101 |
| 2006/0170094 | A1* | 8/2006 | Subramanian | H01L 25/0655 |
| | | | | 257/E21.503 |
| 2006/0246621 | A1* | 11/2006 | Crippen | H01L 23/3677 |
| | | | | 257/E23.101 |
| 2008/0001282 | A1* | 1/2008 | Modi | H01L 21/563 |
| | | | | 257/710 |
| 2008/0090405 | A1* | 4/2008 | Fitzgerald | C22C 28/00 |
| | | | | 438/612 |
| 2008/0111234 | A1* | 5/2008 | Hua | H01L 23/4275 |
| | | | | 428/221 |
| 2009/0085198 | A1* | 4/2009 | Vadakkanmaruveedu | |
| | | | | H01L 23/427 |
| | | | | 257/714 |
| 2011/0304051 | A1* | 12/2011 | Touzelbaev | H01L 23/42 |
| | | | | 257/772 |
| 2013/0081796 | A1* | 4/2013 | Horiuchi | H01L 21/4882 |
| | | | | 156/247 |
| 2014/0061893 | A1* | 3/2014 | Saeidi | H01L 23/562 |
| | | | | 438/122 |
| 2014/0217575 | A1* | 8/2014 | Hung | H01L 23/473 |
| | | | | 257/713 |
| 2014/0328024 | A1* | 11/2014 | Mataya | H05K 7/20454 |
| | | | | 361/720 |
| 2015/0228553 | A1* | 8/2015 | Saeidi | H01L 21/52 |
| | | | | 438/122 |
| 2015/0279761 | A1* | 10/2015 | Bet-Shliemoun | H01L 23/04 |
| | | | | 257/714 |
| 2017/0200667 | A1* | 7/2017 | John | C09D 183/04 |
| 2017/0372979 | A1* | 12/2017 | Gandhi | H01L 23/3675 |
| 2018/0090411 | A1* | 3/2018 | Cetegen | H01L 23/42 |
| 2018/0226375 | A1* | 8/2018 | Enquist | H01L 24/80 |
| 2018/0308782 | A1* | 10/2018 | Campbell | H01L 23/367 |
| 2018/0374776 | A1* | 12/2018 | Liu | H01L 23/3737 |
| 2019/0067157 | A1* | 2/2019 | Lin | H01L 23/433 |
| 2020/0051894 | A1* | 2/2020 | Wan | H01L 23/427 |
| 2020/0066669 | A1* | 2/2020 | Fry | H01L 24/27 |
| 2020/0203254 | A1* | 6/2020 | Dhane | H01L 23/3675 |
| 2020/0219786 | A1* | 7/2020 | Hung | H01L 23/3185 |
| 2021/0280491 | A1* | 9/2021 | Lin | H01L 23/3135 |

* cited by examiner

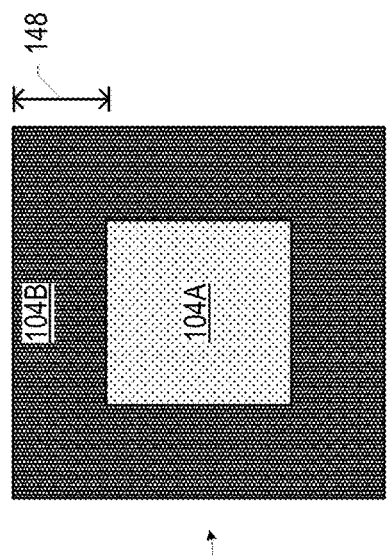
FIG. 2A
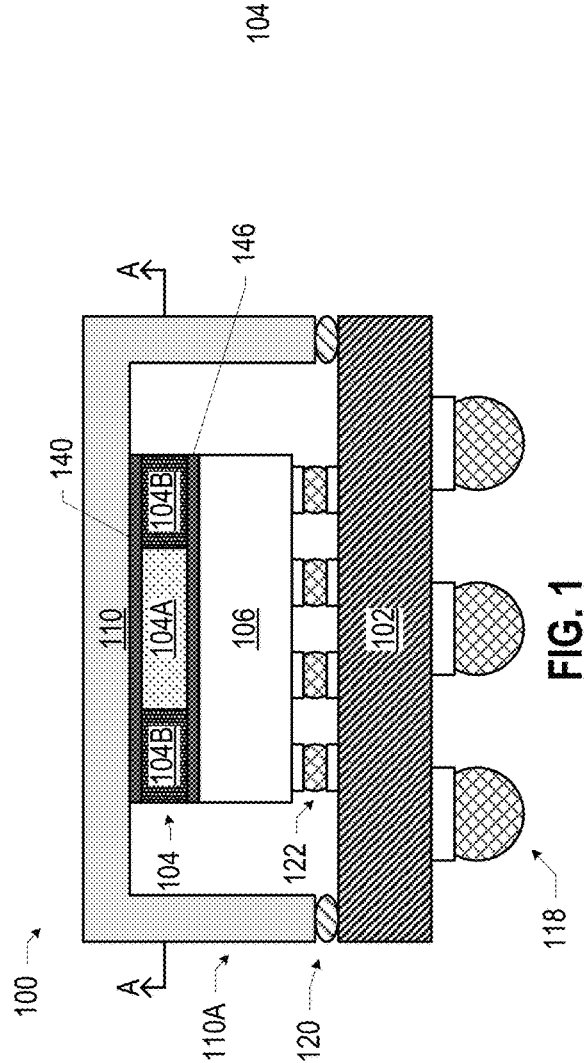
FIG. 1
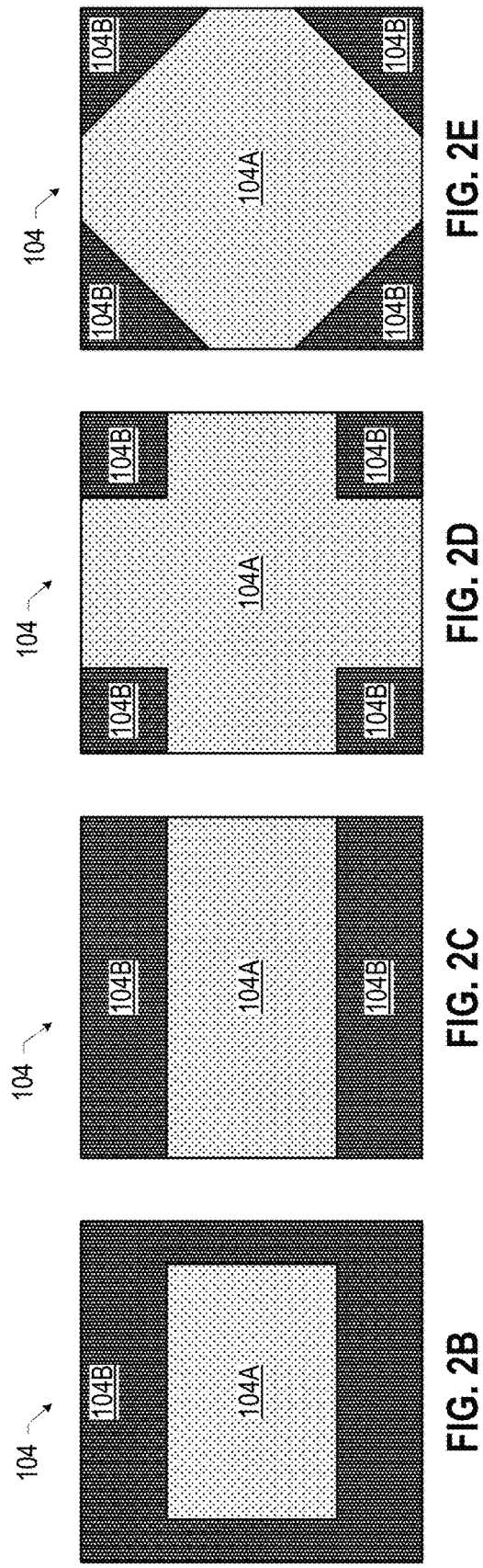
FIG. 2B
FIG. 2C
FIG. 2D
FIG. 2E

INTEGRATED CIRCUIT PACKAGES WITH THERMAL INTERFACE MATERIALS WITH DIFFERENT MATERIAL COMPOSITIONS

BACKGROUND

Many electronic devices generate significant amounts of heat during operation. Some such devices include heat sinks or other components to enable the transfer of heat away from heat-sensitive elements in these devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIG. 1 is a side, cross-sectional view of an integrated circuit (IC) package with multiple thermal interface materials (TIMs), in accordance with various embodiments.

FIGS. 2A-2E are top, cross-sectional views of different arrangements of multiple TIMs in an IC package, in accordance with various embodiments.

DETAILED DESCRIPTION

Figure 3A:
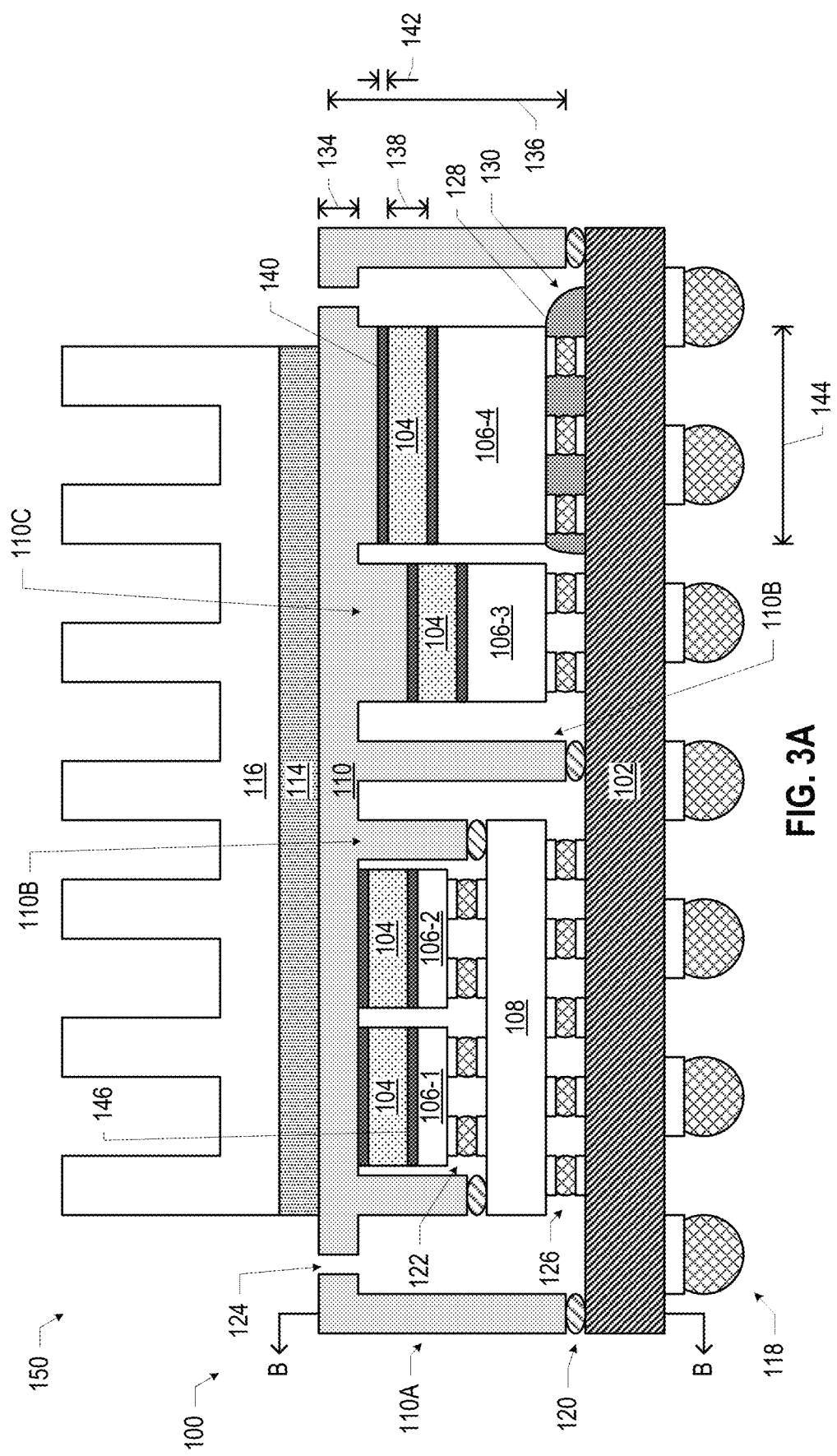
FIGS. 3A-3B are side, cross-sectional views of an IC assembly that may include multiple TIMs, in accordance with various embodiments.

Disclosed herein are integrated circuit (IC) packages with thermal interface materials (TIMs) with different material compositions, as well as related methods and devices. For example, in some embodiments, an IC package may include a package substrate, a die, and TIM, wherein the die is between the TIM and the package substrate along a vertical axis. The TIM may include a first TIM having a first material composition and a second TIM having a second material composition; the first material composition may be different than the second material composition, and the first TIM and the second TIM may be in different locations along a lateral axis perpendicular to the vertical axis.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 2" may be used to refer to the collection of drawings of FIGS. 2A-2E, and the phrase "FIG. 3" may be used to refer to the collection of drawings of FIGS. 3A-3B.

FIG. 1 is a side, cross-sectional view of an example IC package 100 that may include TIMs having different material compositions. The IC package 100 of FIG. 1 includes certain components arranged in a particular manner, but this is simply illustrative, and an IC package 100 in accordance with the present disclosure may take any of a number of forms. FIG. 3, discussed further below, illustrates another example of an IC package 100 in accordance with the present disclosure; any of the elements discussed herein with reference to FIG. 1 may take any of the forms of those elements discussed herein with reference to FIG. 3, and vice versa.

The IC package 100 of FIG. 1 includes a package substrate 102 to which a die 106 is coupled via interconnects 122 (which may be, for example, first-level interconnects). A TIM 104 is in thermal contact with the die 106 and with a lid 110; during operation of the die 106, the TIM 104 may transfer heat generated by the die 106 to the lid 110. The lid 110 may also be referred to as a "heat spreader." To facilitate the coupling between the TIM 104 and the die 106, a top surface of the die 106 may include an adhesion material region 146 to which the TIM 104 may adhere; similarly, a bottom surface of the lid 110 may include an adhesion material region 140 to which the TIM 104 may adhere. The lid 110 may include leg portions 110A that extend towards the package substrate 102, and a sealant 120 (e.g., a polymer-based adhesive) may attach the leg portions 110A of the lid 110 to the top surface of the package substrate 102. The IC package 100 may also include interconnects 118, which may be used to couple the IC package 100 to another component, such as a circuit board (e.g., a motherboard), an interposer, or another IC package, as known in the art and as discussed below with reference to FIG. 6. The interconnects 118 may, in some embodiments, be any suitable second-level interconnects known in the art.

The package substrate 102 may include a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the top and bottom surfaces, or between different locations on the top surface, and/or between different locations on the bottom surface. These conductive pathways may take the form of any of the interconnects 1628 discussed below with reference to FIG. 5 (e.g., including lines and vias). The package substrate 102 may be coupled to the die 106 by interconnects 122, which may include conductive contacts that are coupled to conductive pathways (not shown) through the package substrate 102, allowing circuitry within the die 106 to electrically couple to the interconnects 118 (or to other devices included in the package substrate 102, not shown). As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket). The interconnects 122 illustrated in FIG. 1 include solder bumps, but the interconnects 122 may take any suitable form (e.g., wirebonds, a waveguide, etc.). Similarly, the interconnects 118 illustrated in FIG. 1 include solder balls (e.g., for a ball grid array (BGA) arrangement), but any suitable interconnects 118 may be used (e.g., pins in a pin grid array (PGA) arrangement or lands in a land grid array (LGA) arrangement). Further, although the IC package 100 of FIG. 1 includes a die 106 coupled directly to a package substrate 102, in other embodiments (e.g., as discussed below with reference to FIG. 3), an intermediate component may be disposed between the die 106 and the package substrate 102 (e.g., an interposer 108, as illustrated in FIG. 3, a silicon bridge, an organic bridge, etc.).

The die 106 may take the form of any of the embodiments of the die 1502 discussed below with reference to FIG. 4 (e.g., may include any of the embodiments of the IC device 1600 of FIG. 5). The die 106 may include circuitry to perform any desired functionality. For example, the die 106 may be a logic die (e.g., silicon-based dies), a memory die (e.g., high bandwidth memory), or may include a combination of logic and memory. In embodiments in which the IC package 100 includes multiple dies 106 (e.g., as discussed below with reference to FIG. 3), the IC package 100 may be referred to as a multi-chip package (MCP). An IC package 100 may include passive components not shown in various ones of the accompanying figures for ease of illustration, such as surface-mount resistors, capacitors, and inductors (e.g., coupled to the top or bottom surface of the package substrate 102). More generally, an IC package 100 may include any other active or passive components known in the art.

As noted above, the lid 110 of the IC package 100 of FIG. 1 may include leg portions 110A coupled to the top surface of the package substrate 102 by a sealant 120. In some embodiments, the lid 110 may include copper plated with nickel (e.g., a layer of nickel having a thickness between 5 microns and 10 microns). In some embodiments, the lid 110 may include aluminum or nickel-plated aluminum. The adhesion material region 140 on the underside of the lid 110 may include any suitable material to wet the TIM 104. In some embodiments, the adhesion material region 140 may include gold, silver, or indium. The thickness of the adhesion material region 140 may take any suitable value (e.g., between 0.1 microns and 1 micron, or between 70 nanometers and 400 nanometers). The adhesion material region 140 may be patterned on the underside of the lid 110 to control the location of the TIM 104. Similarly, the top surface of the die 106 may include an adhesion material region 146. The adhesion material region 146, like the adhesion material region 140, may include any suitable material to wet the TIM 104, and may take any of the forms of the adhesion material region 140 discussed above.

Although FIGS. 1 and 3 illustrate a distinct boundary between the adhesion material region 140 and the STIM 104 (and also between the adhesion material region 146 and the STIM 104), in practice, the adhesion material region 140 and the STIM 104 (and the adhesion material region 146 and the STIM 104) may react and form an intermetallic compound (IMC). For example, when the adhesion material region 140 (adhesion material region 146) includes gold and the STIM 104 includes indium, the resulting IMC may be a gold-indium IMC. In an IC package 100, the adhesion material regions 140/146 may not be distinctly visible; instead, the IMC resulting from the reaction between these adhesion material regions 140/146 and the STIM 104 may be present at these interfaces.

The TIM 104 may include different portions having different material compositions. For example, FIG. 1 illustrates an embodiment in which a first TIM 104A is proximate to a center of the die 106 and a second TIM 104B, having a different material composition than the first TIM 104A, is proximate to the edge of the die 106. Different example patterns of the TIMs 104A and 104B are discussed below with reference to FIG. 2. Although FIG. 1 depicts an embodiment in which TIMs having 2 different material compositions are included in the TIM 104, this is simply for ease of illustration, and any of the IC packages 100 disclosed herein may include TIMs having 3 or more different material compositions in any desired arrangement between a die 106 and a lid 110.

The different material compositions of the TIMs 104A and 104B may result in different material properties, and these different material properties may be weighed and utilized to achieve desired mechanical performance, thermal performance, and/or manufacturability. For example, the second TIM 104B (closer to the edge of the die 106) may be selected to have a melting point that is greater than the first TIM 104A (closer to the center of the die 106). For many TIMs (e.g., the solder TIMs discussed below), the melting point may be inversely related to the thermal conductivity: the higher the melting point, the lower the thermal conductivity of the TIM. Also, for many TIMs (e.g., the solder TIMs discussed below), the melting point may be related to the stiffness: the higher the melting point, the higher the stiffness of the TIM. During high temperature manufacturing operations (e.g., the reflow operations that are performed during the manufacturing of a BGA IC package 100, including positioning a solder ball between the IC package 100 and a circuit board or other element, and heating the assembly to cause the solder ball to physically, thermally, and/or electronically adhere the IC package 100 and the circuit board or other element), the first TIM 104A may melt more readily than the second TIM 104B, and thus the second TIM 104B may serve as a barrier against the lateral flow of the first TIM 104A and thus may prevent or mitigate the flow of the TIM 104 out of the volume between the die 106 and the lid 110 (referred to as "bleedout" of the TIM 104) during manufacturing. Further, because the second TIM 104B may have a lower thermal conductivity than the first TIM 104A, utilizing the second TIM 104B (the poorer thermal conductor) proximate to the edges of the die 106 while utilizing the first TIM 104A (the stronger thermal conductor) proximate to the center of the die 106 may still achieve good overall thermal performance of the TIM 104. Relatedly, because the second TIM 104B may have a greater stiffness than the first TIM 104A, utilizing the second TIM 104B (the stiff material, and thus the material more likely to add mechanical stress to the IC package 100 that may shorten its lifetime) proximate to the edges of the die 106 while utilizing the first TIM 104A (the less stiff material) proximate to the center of the die 106 may still achieve good overall mechanical performance of the TIM 104.

In some embodiments, the TIM 104 may be a solder TIM; the first TIM 104A may be a solder TIM with a first material composition and the second TIM 104B may be a solder TIM with a second material composition different than the first. In some embodiments, the first TIM 104A and the second TIM 104B may be indium-based solders, but the first TIM 104A may have a higher indium content (and thus a lower melting point) than the second TIM 104B. For example, the first TIM 104A may be a pure indium solder, while the second TIM 104B may be an indium alloy solder (e.g., an indium-tin solder, an indium-silver solder, an indium-gold solder, an indium-nickel solder, or an indium-aluminum solder). Other combinations of materials for the first TIM 104A and the second TIM 104B may be used.

In some embodiments, the TIM 104 may be a polymer TIM; the first TIM 104A may be a polymer TIM with a first material composition and a second TIM 104B may be a polymer TIM with a second material composition different than the first. Polymer TIMs typically do not melt during the manufacturing operations associated with BGA processing, but it may be advantageous for a TIM 104 to utilize polymer TIMs with different material compositions to achieve other goals (e.g., to trade-off between adhesion strength and thermal conductivity in a particular application). In some embodiments, the TIM 104 may include a solder TIM and a polymer TIM; for example, the first TIM 104A may be a solder TIM and the second TIM 104B may be a polymer TIM.

As noted above, TIMs with different material compositions may be arranged in any desired manner in the space between a die 106 and a lid 110 of an IC package 100. FIGS. 2A-2E illustrate some example arrangements of a first TIM 104A and a second TIM 104B in an IC package 100, along the cross-section A-A of FIG. 1. Any of the arrangements illustrated in FIG. 2 may be modified to include TIMs with more than two different material compositions (e.g., different portions of the TIMs 104 of FIG. 2 may be provided by TIMs with different material compositions in any desired manner).

FIG. 2A illustrates an embodiment in which a perimeter portion of the TIM 104 is provided by the second TIM 104B, while a central portion of the TIM 104 is provided by the first TIM 104A. The perimeter portion of the second TIM 104B extends around and is proximate to all edges of the die 106, laterally surrounding the central portion provided by the first TIM 104A (and thus limiting bleedout of the first TIM 104A in all lateral direction). In some embodiments, the width 148 of a perimeter portion of the TIM 104 may be between 2 millimeters and 10 millimeters. The width 148 of a perimeter portion of the TIM 104 may not be uniform; for example, FIG. 2B illustrates an embodiment in which a perimeter portion of the TIM 104 is provided by the second TIM 104B (while a central portion of the TIM 104 is provided by the first TIM 104A), but the width of the perimeter portion is not uniform around the perimeter.

FIG. 2C illustrates an embodiment in which two opposing edge portions of the TIM 104 are provided by the second TIM 104B, while a central portion of the TIM 104 is provided by the first TIM 104A. In this embodiment, the second TIM 104B does not laterally surround the first TIM 104A, but bounds the first TIM 104A on 2 sides. Such an embodiment may be particularly advantageous when bleedout of the first TIM 104A is likely to happen in a particular lateral direction; the use of an edge portion provided by the second TIM 104B in that lateral direction may mitigate such bleedout. The width of the edge portions may take any of the forms discussed above with reference to the width 148.

FIG. 2D illustrates an embodiment in which corner portions of the TIM 104 are provided by the second TIM 104B, while a central portion of the TIM 104 is provided by the first TIM 104A. Such an embodiment may be particularly advantageous when bleedout of the first TIM 104A is likely to happen at the corners of the die 106; the use of corner portions provided by the second TIM 104B may mitigate such bleedout. In the embodiment of FIG. 2D, the first TIM 104A is cross-shaped. The width of the corner portions may take any of the forms discussed above with reference to the width 148. Although FIG. 2 largely illustrates portions of TIM 104 having substantially rectangular shapes, in practical application, the resulting shapes will be substantially rounded. Further, non-rectangular shapes may be utilized as desired; for example, FIG. 2E illustrates an embodiment in which triangular corner portions of the TIM 104 are provided by the second TIM 104B, while a central portion of the TIM 104 is provided by the first TIM 104A.

The TIMs 104 disclosed herein may be manufactured using any suitable technique. For example, in some embodiments, sections of the first and second TIMs 104A/104B (and additional TIMs, as desired) may be arranged in a desired pattern and then rolled to flatten and couple the different TIMs to each other. In other embodiments, sections of the first and second TIMs 104A/104B (and additional TIMs, as desired) may be arranged in a desired pattern on the top surface of the corresponding die 106, and then heat may be applied to melt the TIMs.

In some embodiments, an IC package 100 may include a first TIM 104A that has been previously melted in place between the die 106 and the lid 110, and a second TIM 104B that was not previously melted in place between the die 106 and the lid 110 (e.g., the TIM 104B may be in a preformed state); such an IC package 100 may be sold to a customer or otherwise handled, and then the second TIM 104B may be subsequently melted and allowed to solidify in place. The opposite embodiment may also be used; an IC package 100 may include a second TIM 104B that has been previously melted in place between the die 106 and the lid 110, and a first TIM 104A that was not previously melted in place between the die 106 and the lid 110. Such embodiments may enable a two-stage reflow process in which the unmelted TIM 104 controls the distance between the die 106 and the lid 110.

Figure 3B:
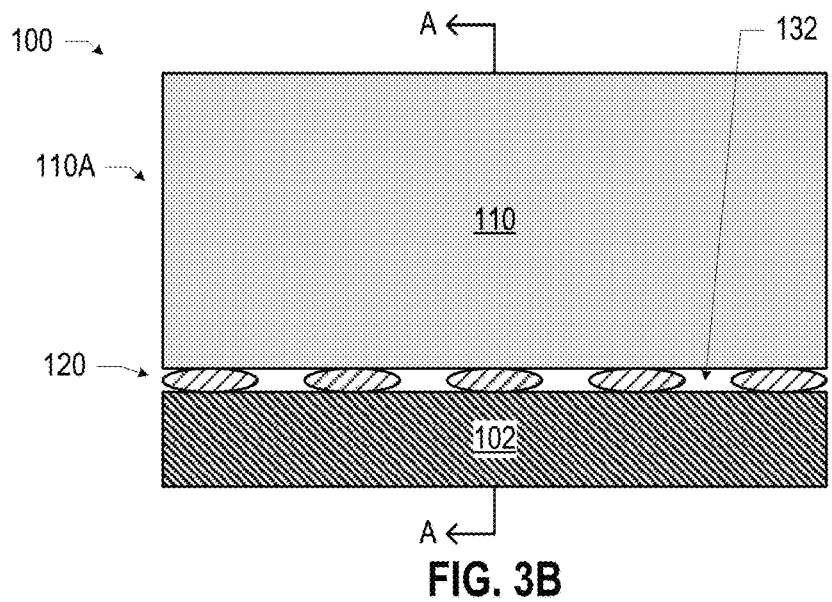

FIG. 3 depicts various views of example IC assembly 150 including an example IC package 100; in particular, FIG. 3B is a side, cross-sectional view through the section B-B of FIG. 3A, and FIG. 3A is a side, cross-sectional view through the section A-A of FIG. 3B. Any one or more of the TIMs 104 illustrated in FIG. 3 may include portions having different material compositions in accordance with any of the embodiments discussed above with reference to FIGS. 1 and 2. More generally, any of the elements of FIG. 3 may take the form of any corresponding elements in FIG. 1; discussion of these elements will not be repeated. Similarly, an IC package 100 or an IC assembly 150 may include any combination or subset of the elements of FIGS. 1-3; for example, the IC package 100 of FIG. 1 may include one or more vent holes 124 and/or one or more pedestals 110C, the IC package 100 of FIG. 3 may include fewer or no rib portions 110B, etc.

The IC assembly 150 includes an IC package 100, a heat sink 116, and a TIM 114 therebetween. The TIM 114 may aid in the transfer of heat from the lid 110 to the heat sink 116, and the heat sink 116 may be designed to readily dissipate heat into the surrounding environment, as known in the art. In some embodiments, the TIM 114 may be a polymer TIM.

The IC package 100 of FIG. 3 is an MCP and includes four dies 106-1, 106-2, 106-3, and 106-4. The particular number and arrangement of dies in FIG. 3 is simply illustrative, and any number and arrangement may be included in an IC package 100. The dies 106-1 and 106-2 are coupled to an interposer 108 by interconnects 122, and the interposer 108 is coupled to the package substrate 102 by interconnects 126 (which may take the form of any of the interconnects 122 disclosed herein, such as first-level interconnects). The interposer 108 may be a silicon interposer (providing conductive pathways between the die 106-1 and the die 106-2), and may or may not include any active devices (e.g., transistors) and/or passive devices (e.g., capacitors, inductors, resistors, etc.). The dies 106-3 and 106-4 are coupled to the package substrate 102 directly. Any of the dies 106 disclosed herein may have any suitable dimensions; for example, in some embodiments, a die 106 may have a side length 144 between 5 millimeters and 50 millimeters. The multiple-material-composition TIMs 104 disclosed herein may be particularly beneficial for use with dies 106 having a footprint greater than 225 square millimeters (e.g., a footprint greater than 400 square millimeters).

All of the dies 106 of FIG. 3 include an adhesion material region 146 on the top surface, and the lid 110 includes corresponding adhesion material regions 140 on its underside; different portions of TIM 104 are between corresponding adhesion material regions 140/146, and as noted above, any one or more of them may include a TIM having multiple different material compositions, as discussed above with reference to FIGS. 1-2. In some embodiments, a thickness 138 of a portion of the TIM 104 may be less than 1 millimeter (e.g., between 200 microns and 400 microns, between 100 microns and 600 microns, between 100 microns and 500 microns, between 5 mils and 25 mils, or between 9 mils and 16 mils). In some embodiments, the adhesion material region 140 may have a thickness 142 between 0.1 microns and 1 micron; the thickness of the adhesion material region 146 may be in the same range. As discussed above, the thickness of the STIM 104 of FIG. 3 may, in practice, include portions of IMC (not shown) proximate to or in place of the adhesion material regions 140/146; in some embodiments, a portion of IMC may have a thickness between 2 microns and 20 microns.

The lid 110 of FIG. 3 includes leg portions 110A, as discussed above with reference to FIG. 1, and also includes rib portions 110B and pedestals 110C. In some embodiments, a height 136 of the leg portions 110A may be between 600 microns and 1 millimeter. Rib portions 110B may provide mechanical support to the lid 110, and may control spacing between various elements of the IC package 100 and the lid 110. FIG. 3 illustrates a single rib portion 110B coupled to the package substrate 102 by a sealant 120, and also illustrates two rib portions 110B coupled to a top surface of the interposer 108 by sealant 120. Pedestals 110C may be "downward" projections in the upper portion of the lid 110 that bring the material of the lid 110 into closer proximity with a corresponding die 106; for example, FIG. 3 illustrates pedestals 110C associated with each of the dies 106-3 and 106-4. The pedestals 110C may have adhesion material regions 140 thereon, as shown, and portions of TIM 104 (which may include multiple TIMs with different material compositions, as discussed herein) may be disposed between the pedestals 110C and the associated dies 106-3/106-4, as shown. In some embodiments, a minimum thickness 134 of the upper portion of the lid 110 may be between 0.5 millimeters and 4 millimeters (e.g., between 0.5 millimeters and 3 millimeters, or between 0.7 millimeters and 3.5 millimeters).

In some embodiments, the lid 110 may include one or more vent holes 124 in locations that are not above a die 106 (e.g., proximate to the leg portions 110A, as shown). These vent holes 124 may allow gas generated during manufacturing (e.g., gas generated by heated flux on a solder TIM 104 during BGA processing) to escape into the environment and for pressure to be equalized under and outside of the lid 110. In some embodiments, gaps 132 in the sealant 120 between the leg portions 110A and the package substrate 102 may allow gas to escape (instead of or in addition to the use of vent holes 124) and for pressure to be equalized under and outside of the lid 110; an example of such gaps is illustrated in FIG. 3B.

In some embodiments, an underfill material 128 may be disposed around the interconnects coupling an element to the package substrate 102 (e.g., around the interconnects 126 between the interposer 108 and the package substrate 102, and/or around the interconnects 122 between the dies 106-3/106-4 and the package substrate 102). The underfill material 128 may provide mechanical support to these interconnects, helping mitigate the risk of cracking or delamination due to differential thermal expansion between the package substrate 102 and the dies 106/interposer 108. A single portion of underfill material 128 is depicted in FIG. 3 for ease of illustration, but portions of underfill material 128 may be used in any desired locations. Example materials that may be used for the underfill material 128 include epoxy materials. In some embodiments, the underfill material 128 is created by depositing a fluid underfill material 128 at a location on the package substrate 102 that is next to the die 106 (or other element), and allowing capillary action to draw the fluid underfill material 128 into the area between the die 106 and the package substrate 102. Such a technique may result in an asymmetric distribution of the underfill material 128 relative to the footprint of the die 106 (or other element); in particular, a tongue 130 of underfill material 128 may extend farther out away from the die 106 on the side where the underfill material 128 was initially deposited than on other sides of the die 106. An example of this is shown in FIG. 3A.

The IC packages 100 disclosed herein may include, or may be included in, any suitable electronic component. FIGS. 4-7 illustrate various examples of apparatuses that may be included in any of the IC packages 100 disclosed herein, or may include any of the IC packages 100 disclosed herein.

Figure 4:
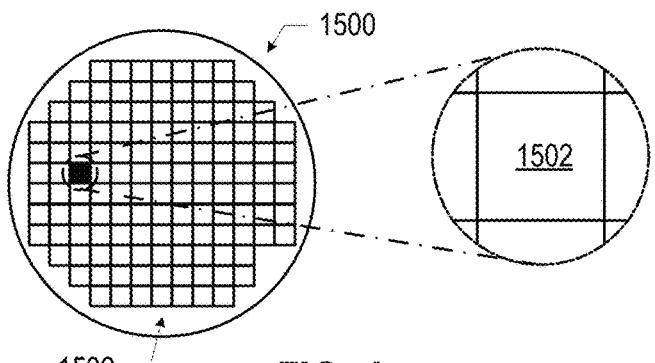
FIG. 4 is a top view of a wafer and dies that may be included in an IC package with multiple TIMs, in accordance with various embodiments.

FIG. 4 is a top view of a wafer 1500 and dies 1502 that may be included in an IC package 100, in accordance with various embodiments. For example, a die 1502 may be a die 106. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 5, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 7) or other logic that is configured to store information in the memory devices or execute instructions stored in the memory array.

Figure 5:
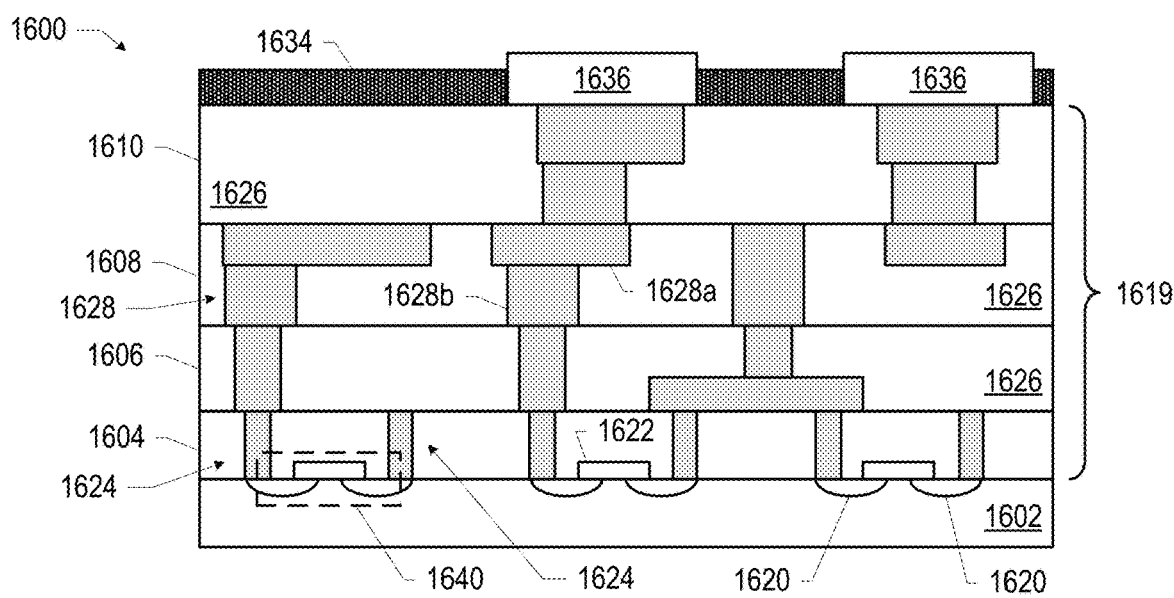
FIG. 5 is a side, cross-sectional view of an IC device that may be included in an IC package with multiple TIMs, in accordance with various embodiments.

FIG. 5 is a side, cross-sectional view of an IC device 1600 that may be included in an IC package 100, in accordance with various embodiments. For example, the IC device 1600 may be a die 106. One or more of the IC devices 1600 may be included in one or more dies 1502 (FIG. 4). The IC device 1600 may be formed on a substrate 1602 (e.g., the wafer 1500 of FIG. 4) and may be included in a die (e.g., the die 1502 of FIG. 4). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 4) or a wafer (e.g., the wafer 1500 of FIG. 4).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 5 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 5 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 5). Although a particular number of interconnect layers 1606-1610 is depicted in FIG. 5, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 5. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 5. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 5, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 6:
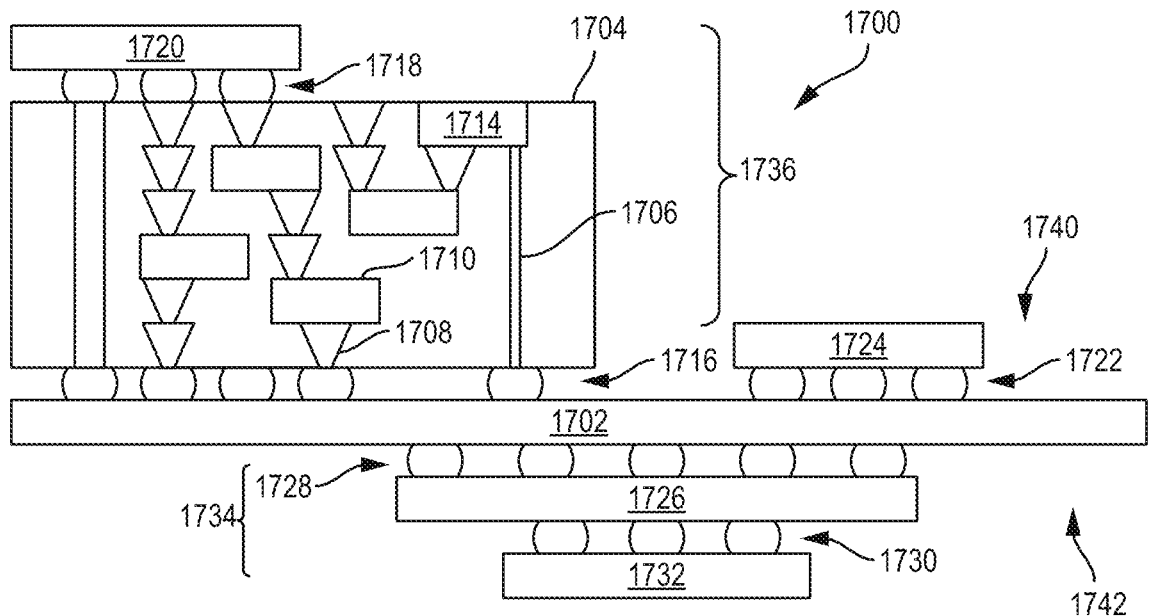
FIG. 6 is a side, cross-sectional view of an IC assembly that may include an IC package with multiple TIMs, in accordance with various embodiments.

FIG. 6 is a side, cross-sectional view of an IC assembly 1700 that may include one or more IC packages 100, in accordance with various embodiments. For example, any of the IC packages included in the IC assembly 1700 may be an IC package 100 (e.g., may include TIMs having different material compositions). The IC assembly 1700 includes a number of components disposed on a circuit board 1702 (which may be, e.g., a motherboard). The IC assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC assembly 1700 illustrated in FIG. 6 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 6), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 6, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 4), an IC device (e.g., the IC device 1600 of FIG. 5), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 6, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC assembly 1700 illustrated in FIG. 6 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 7:
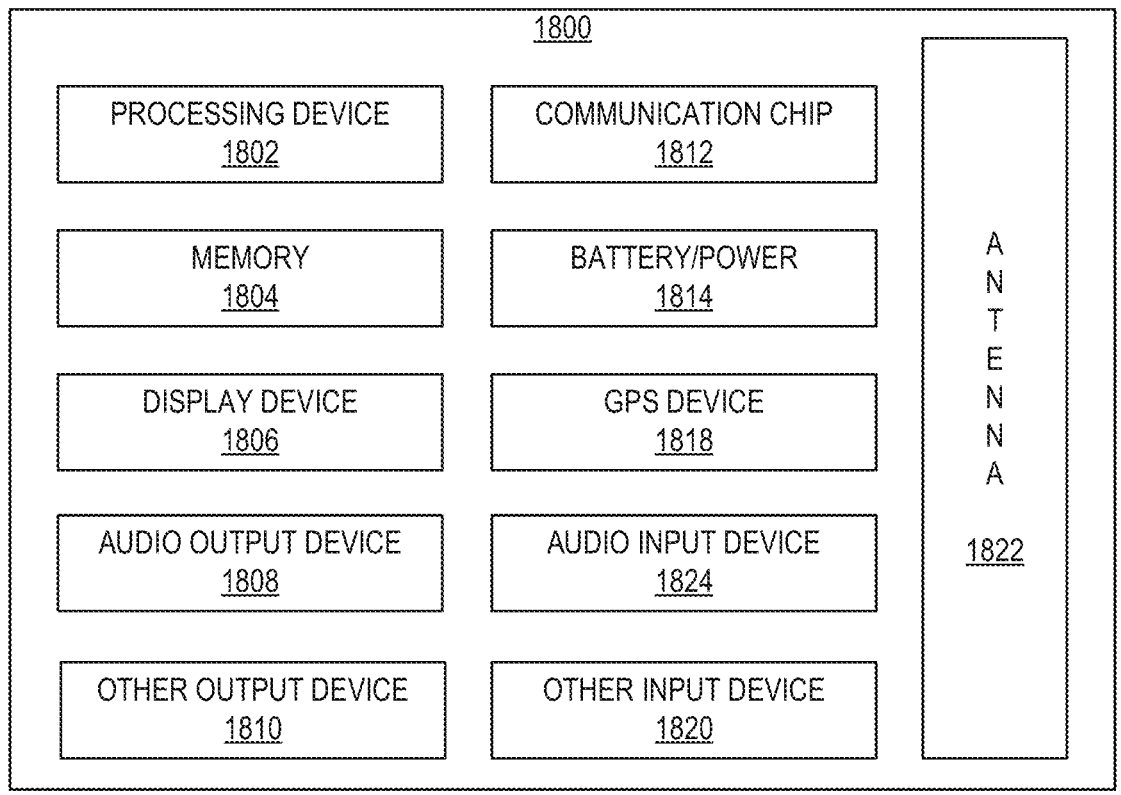
FIG. 7 is a block diagram of an example electrical device that may include an IC package with multiple TIMs, in accordance with various embodiments.

FIG. 7 is a block diagram of an example electrical device 1800 that may include one or more IC packages 100, in accordance with various embodiments. For example, any suitable ones of the components of the electrical device 1800 may include one or more of the IC assemblies 150/1700, IC packages 100, IC devices 1600, or dies 1502 disclosed herein. A number of components are illustrated in FIG. 7 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 7, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) package, including: a package substrate; a die; a lid, wherein the die is between the package substrate and the lid along a vertical axis; and a solder thermal interface material (TIM) between the die and the lid, wherein the solder TIM includes a first solder TIM having a first material composition and a second solder TIM having a second material composition, the first material composition is different than the second material composition, and the first solder TIM and the second solder TIM are in different locations along a lateral axis perpendicular to the vertical axis.

Example 2 includes the subject matter of Example 1, and further specifies that the first solder TIM is proximate to a center of the die and the second solder TIM is proximate to an edge of the die.

Example 3 includes the subject matter of Example 2, and further specifies that the first solder TIM and the second solder TIM include indium.

Example 4 includes the subject matter of any of Examples 2-3, and further specifies that the first solder TIM has a higher indium content than the second solder TIM.

Example 5 includes the subject matter of any of Examples 2-4, and further specifies that the first solder TIM includes pure indium.

Example 6 includes the subject matter of any of Examples 2-5, and further specifies that the second solder TIM includes tin, silver, gold, aluminum, or nickel.

Example 7 includes the subject matter of Example 6, and further specifies that the second solder TIM includes indium.

Example 8 includes the subject matter of any of Examples 2-7, and further specifies that the second solder TIM includes a perimeter portion.

Example 9 includes the subject matter of Example 8, and further specifies that the first solder TIM is laterally surrounded by the second solder TIM.

Example 10 includes the subject matter of any of Examples 2-9, and further specifies that the second solder TIM includes one or more corner portions.

Example 11 includes the subject matter of Example 10, and further specifies that the second solder TIM includes corner portions corresponding to each corner of the die.

Example 12 includes the subject matter of any of Examples 10-11, and further specifies that the first solder TIM includes a cross-shaped portion.

Example 13 includes the subject matter of any of Examples 2-12, and further specifies that the second solder TIM includes one or more edge portions.

Example 14 includes the subject matter of Example 13, and further specifies that the second solder TIM includes edge portions proximate to two opposing edges of the die.

Example 15 includes the subject matter of Example 2, and further specifies that the first solder TIM has a lower melting point than the second solder TIM.

Example 16 includes the subject matter of any of Examples 15, and further specifies that the first solder TIM has a higher thermal conductivity than the second solder TIM.

Example 17 includes the subject matter of Example 1, and further specifies that the first solder TIM and the second solder TIM include indium.

Example 18 includes the subject matter of Example 17, and further specifies that the first solder TIM has a higher indium content than the second solder TIM.

Example 19 includes the subject matter of Example 18, and further specifies that the first solder TIM includes pure indium.

Example 20 includes the subject matter of any of Examples 18-19, and further specifies that the second solder TIM includes tin, silver, gold, aluminum, or nickel.

Example 21 includes the subject matter of any of Examples 1-20, and further specifies that the die has a footprint greater than 225 square millimeters.

Example 22 includes the subject matter of any of Examples 1-21, and further specifies that the die has a footprint greater than 400 square millimeters.

Example 23 includes the subject matter of any of Examples 1-22, and further specifies that the lid includes copper or aluminum.

Example 24 includes the subject matter of Example 23, and further specifies that the lid includes nickel.

Example 25 includes the subject matter of any of Examples 23-24, and further specifies that the lid includes a metal region in contact with the solder TIM, and the metal region includes gold or silver.

Example 26 includes the subject matter of Example 25, and further specifies that the metal region has a thickness between Example 0.1 microns and 1 micron.

Example 27 includes the subject matter of any of Examples 1-26, and further specifies that the solder TIM has a thickness between 100 microns and 1 millimeter.

Example 28 includes the subject matter of any of Examples 1-27, and further specifies that the die includes a metal region in contact with the solder TIM.

Example 29 includes the subject matter of Example 28, and further specifies that the metal region includes gold or silver.

Example 30 includes the subject matter of any of Examples 1-29, and further includes: sealant between a foot of the lid and the package substrate.

Example 31 includes the subject matter of Example 30, and further includes: gaps in the sealant.

Example 32 includes the subject matter of any of Examples 1-31, and further specifies that the lid includes a pedestal, and the die is between the pedestal and the package substrate.

Example 33 includes the subject matter of any of Examples 1-32, and further includes: an interposer, wherein the interposer is between the die and the package substrate.

Example 34 includes the subject matter of any of Examples 1-33, and further specifies that the first solder TIM is previously melted in place and the second solder TIM is not previously melted in place.

Example 35 is an integrated circuit (IC) package, including: a package substrate; a die; and a thermal interface material (TIM), wherein the die is between the TIM and the package substrate along a vertical axis, the TIM includes a first TIM having a first material composition and a second TIM having a second material composition, the first material composition is different than the second material composition, and the first TIM and the second TIM are in different locations along a lateral axis perpendicular to the vertical axis.

Example 36 includes the subject matter of Example 35, and further specifies that the first TIM is proximate to a center of the die and the second TIM is proximate to an edge of the die.

Example 37 includes the subject matter of Example 36, and further specifies that the first TIM and the second TIM include indium.

Example 38 includes the subject matter of any of Examples 36-37, and further specifies that the first TIM has a higher indium content than the second TIM.

Example 39 includes the subject matter of any of Examples 36-38, and further specifies that the first TIM includes pure indium.

Example 40 includes the subject matter of any of Examples 36-39, and further specifies that the second TIM includes tin, silver, gold, aluminum, or nickel.

Example 41 includes the subject matter of Example 40, and further specifies that the second TIM includes indium.

Example 42 includes the subject matter of any of Examples 36-41, and further specifies that the second TIM includes a perimeter portion.

Example 43 includes the subject matter of Example 42, and further specifies that the first TIM is laterally surrounded by the second TIM.

Example 44 includes the subject matter of any of Examples 36-43, and further specifies that the second TIM includes one or more corner portions.

Example 45 includes the subject matter of Example 44, and further specifies that the second TIM includes corner portions corresponding to each corner of the die.

Example 46 includes the subject matter of any of Examples 44-45, and further specifies that the first TIM includes a cross-shaped portion.

Example 47 includes the subject matter of any of Examples 36-46, and further specifies that the second TIM includes one or more edge portions.

Example 48 includes the subject matter of Example 47, and further specifies that the second TIM includes edge portions proximate to two opposing edges of the die.

Example 49 includes the subject matter of Example 36, and further specifies that the first TIM has a lower melting point than the second TIM.

Example 50 includes the subject matter of Example 49, and further specifies that the first TIM has a higher thermal conductivity than the second TIM.

Example 51 includes the subject matter of Example 35, and further specifies that the first TIM and the second TIM are solder TIMs.

Example 52 includes the subject matter of Example 51, and further specifies that the first TIM and the second TIM include indium.

Example 53 includes the subject matter of Example 52, and further specifies that the first TIM has a higher indium content than the second TIM.

Example 54 includes the subject matter of Example 53, and further specifies that the first TIM includes pure indium.

Example 55 includes the subject matter of any of Examples 53-54, and further specifies that the second TIM includes tin, silver, gold, aluminum, or nickel.

Example 56 includes the subject matter of any of Examples 35-55, and further specifies that the die has a footprint greater than 225 square millimeters.

Example 57 includes the subject matter of any of Examples 35-56, and further specifies that the die has a footprint greater than 400 square millimeters.

Example 58 includes the subject matter of any of Examples 35-57, and further includes: a lid, wherein the die is between the package substrate and the lid along the vertical axis.

Example 59 includes the subject matter of Example 58, and further specifies that the lid includes copper or aluminum.

Example 60 includes the subject matter of Example 59, and further specifies that the lid includes nickel.

Example 61 includes the subject matter of any of Examples 58-60, and further specifies that the lid includes a metal region in contact with the TIM, and the metal region includes gold or silver.

Example 62 includes the subject matter of Example 61, and further specifies that the metal region has a thickness between Example 0.1 microns and 1 micron.

Example 63 includes the subject matter of any of Examples 58-62, and further specifies that the lid includes a pedestal, and the die is between the pedestal and the package substrate.

Example 64 includes the subject matter of any of Examples 35-63, and further specifies that the TIM has a thickness between 100 microns and 1 millimeter.

Example 65 includes the subject matter of any of Examples 35-64, and further specifies that the die includes a metal region in contact with the TIM.

Example 66 includes the subject matter of Example 65, and further specifies that the metal region includes gold or silver.

Example 67 includes the subject matter of any of Examples 35-66, and further includes: sealant between a foot of the lid and the package substrate.

Example 68 includes the subject matter of Example 67, and further includes: gaps in the sealant.

Example 69 includes the subject matter of any of Examples 35-68, and further includes: an interposer, wherein the interposer is between the die and the package substrate.

Example 70 includes the subject matter of any of Examples 35-69, and further specifies that the first TIM is previously melted in place and the second TIM is not previously melted in place.

Example 71 includes the subject matter of Example 35, and further specifies that the first TIM is a solder TIM and the second TIM is a polymer TIM.

Example 72 is an integrated circuit (IC) assembly, including: an IC package including a solder thermal interface material (TIM) between a die of the IC package and a lid of the IC package, wherein the solder TIM includes a first solder TIM proximate to a center of the die and a second solder TIM proximate to an edge of the die, and the first solder TIM has a different material composition than the second solder TIM; and a circuit board coupled to the IC package.

Example 73 includes the subject matter of Example 72, and further specifies that the circuit board is a motherboard.

Example 74 includes the subject matter of Example 72, and further specifies that the first solder TIM and the second solder TIM include indium.

Example 75 includes the subject matter of any of Examples 72-74, and further specifies that the first solder TIM has a higher indium content than the second solder TIM.

Example 76 includes the subject matter of any of Examples 72-75, and further specifies that the first solder TIM includes pure indium.

Example 77 includes the subject matter of any of Examples 72-76, and further specifies that the second solder TIM includes tin, silver, gold, aluminum, or nickel.

Example 78 includes the subject matter of Example 77, and further specifies that the second solder TIM includes indium.

Example 79 includes the subject matter of any of Examples 72-78, and further specifies that the second solder TIM includes a perimeter portion.

Example 80 includes the subject matter of Example 79, and further specifies that the first solder TIM is laterally surrounded by the second solder TIM.

Example 81 includes the subject matter of any of Examples 72-80, and further specifies that the second solder TIM includes one or more corner portions.

Example 82 includes the subject matter of Example 81, and further specifies that the second solder TIM includes corner portions corresponding to each corner of the die.

Example 83 includes the subject matter of any of Examples 81-82, and further specifies that the first solder TIM includes a cross-shaped portion.

Example 84 includes the subject matter of any of Examples 72-83, and further specifies that the second solder TIM includes one or more edge portions.

Example 85 includes the subject matter of Example 84, and further specifies that the second solder TIM includes edge portions proximate to two opposing edges of the die.

Example 86 includes the subject matter of Example 72, and further specifies that the first solder TIM has a lower melting point than the second solder TIM.

Example 87 includes the subject matter of Example 86, and further specifies that the first solder TIM has a higher thermal conductivity than the second solder TIM.

Example 88 includes the subject matter of Example 72, and further specifies that the first solder TIM and the second solder TIM include indium.

Example 89 includes the subject matter of Example 88, and further specifies that the first solder TIM has a higher indium content than the second solder TIM.

Example 90 includes the subject matter of Example 89, and further specifies that the first solder TIM includes pure indium.

Example 91 includes the subject matter of any of Examples 89-90, and further specifies that the second solder TIM includes tin, silver, gold, aluminum, or nickel.

Example 92 includes the subject matter of any of Examples 72-91, and further specifies that the die has a footprint greater than 225 square millimeters.

Example 93 includes the subject matter of any of Examples 72-92, and further specifies that the die has a footprint greater than 400 square millimeters.

Example 94 includes the subject matter of any of Examples 72-93, and further specifies that the lid includes copper or aluminum.

Example 95 includes the subject matter of Example 94, and further specifies that the lid includes nickel.

Example 96 includes the subject matter of any of Examples 94-95, and further specifies that the lid includes a metal region in contact with the solder TIM, and the metal region includes gold or silver.

Example 97 includes the subject matter of Example 96, and further specifies that the metal region has a thickness between Example 0.1 microns and 1 micron.

Example 98 includes the subject matter of any of Examples 72-97, and further specifies that the solder TIM has a thickness between 100 microns and 1 millimeter.

Example 99 includes the subject matter of any of Examples 72-98, and further specifies that the die includes a metal region in contact with the solder TIM.

Example 100 includes the subject matter of Example 99, and further specifies that the metal region includes gold or silver.

Example 101 includes the subject matter of any of Examples 72-100, and further includes: sealant between a foot of the lid and a package substrate of the IC package.

Example 102 includes the subject matter of Example 101, and further includes: gaps in the sealant.

Example 103 includes the subject matter of any of Examples 72-102, and further specifies that the lid includes a pedestal, and the die is between the pedestal and the circuit board.

Example 104 includes the subject matter of any of Examples 72-103, and further includes: an interposer, wherein the interposer is between the die and the circuit board.

Example 105 includes the subject matter of any of Examples 72-104, and further specifies that the first solder TIM is previously melted in place and the second solder TIM is not previously melted in place.

Example 106 includes the subject matter of any of Examples 72-105, and further includes: a heat sink, wherein the lid is between the heat sink and the circuit board.

Example 107 includes the subject matter of Example 106, and further includes: a polymer TIM between the lid and the heat sink.

Example 108 includes the subject matter of any of Examples 72-107, and further includes: a housing around the IC package and the circuit board.

Example 109 includes the subject matter of any of Examples 72-108, and further includes: wireless communication circuitry communicatively coupled to the circuit board.

Example 110 includes the subject matter of any of Examples 72-109, and further includes: a display communicatively coupled to the circuit board.

Example 111 includes the subject matter of any of Examples 72-110, and further specifies that the IC assembly is a mobile computing device.

Example 112 includes the subject matter of any of Examples 72-110, and further specifies that the IC assembly is a server computing device.

Example 113 includes the subject matter of any of Examples 72-110, and further specifies that the IC assembly is a wearable computing device.

Example 114 is an integrated circuit (IC) package, including: a package substrate; a die; a lid, wherein the die is between the package substrate and the lid along a vertical axis; and a thermal interface material (TIM) between the die and the lid, wherein the TIM includes a solder TIM and a polymer TIM, and the solder TIM and the polymer TIM are in different locations along a lateral axis perpendicular to the vertical axis.

Example 115 includes the subject matter of Example 114, and further specifies that the solder TIM is proximate to a center of the die and the polymer TIM is proximate to an edge of the die.

Example 116 includes the subject matter of Example 115, and further specifies that the solder TIM includes indium.

Example 117 includes the subject matter of any of Examples 115-116, and further specifies that the solder TIM includes pure indium.

Example 118 includes the subject matter of any of Examples 115-117, and further specifies that the solder TIM includes tin, silver, gold, aluminum, or nickel.

Example 119 includes the subject matter of any of Examples 115-118, and further specifies that the polymer TIM includes a perimeter portion.

Example 120 includes the subject matter of Example 119, and further specifies that the solder TIM is laterally surrounded by the polymer TIM.

Example 121 includes the subject matter of any of Examples 115-120, and further specifies that the polymer TIM includes one or more corner portions.

Example 122 includes the subject matter of Example 121, and further specifies that the polymer TIM includes corner portions corresponding to each corner of the die.

Example 123 includes the subject matter of any of Examples 121-122, and further specifies that the solder TIM includes a cross-shaped portion.

Example 124 includes the subject matter of any of Examples 115-124, and further specifies that the polymer TIM includes one or more edge portions.

Example 125 includes the subject matter of Example 124, and further specifies that the polymer TIM includes edge portions proximate to two opposing edges of the die.

Example 126 includes the subject matter of any of Examples 114-125, and further specifies that the solder TIM has a lower melting point than the polymer TIM.

Example 127 includes the subject matter of Example 126, and further specifies that the solder TIM has a higher thermal conductivity than the polymer TIM.

Example 128 includes the subject matter of any of Examples 114-127, and further specifies that the die has a footprint greater than 225 square millimeters.

Example 129 includes the subject matter of any of Examples 114-128, and further specifies that the die has a footprint greater than 400 square millimeters.

Example 130 includes the subject matter of any of Examples 114-129, and further specifies that the lid includes copper or aluminum.

Example 131 includes the subject matter of Example 130, and further specifies that the lid includes nickel.

Example 132 includes the subject matter of any of Examples 130-131, and further specifies that the lid includes a metal region in contact with the solder TIM, and the metal region includes gold or silver.

Example 133 includes the subject matter of Example 132, and further specifies that the metal region has a thickness between Example 0.1 microns and 1 micron.

Example 134 includes the subject matter of any of Examples 114-133, and further specifies that the solder TIM has a thickness between 100 microns and 1 millimeter.

Example 135 includes the subject matter of any of Examples 114-134, and further specifies that the die includes a metal region in contact with the solder TIM.

Example 136 includes the subject matter of Example 135, and further specifies that the metal region includes gold or silver.

Example 137 includes the subject matter of any of Examples 114-136, and further includes: sealant between a foot of the lid and the package substrate.

Example 138 includes the subject matter of Example 137, and further includes: gaps in the sealant.

Example 139 includes the subject matter of any of Examples 114-138, and further specifies that the lid includes a pedestal, and the die is between the pedestal and the package substrate.

Example 140 includes the subject matter of any of Examples 114-139, and further includes: an interposer, wherein the interposer is between the die and the package substrate.

The invention claimed is:

1. An integrated circuit (IC) package, comprising:
a package substrate;
a die;
a lid, wherein the die is between the package substrate and the lid along a vertical axis; and
a solder thermal interface material (TIM) between the die and the lid, wherein the solder TIM includes a first solder TIM having a first material composition and a second solder TIM having a second material composition, the first material composition is different from the second material composition, at least a portion of the first solder TIM is closer to a center of the die than all of the second solder TIM, the first solder TIM is proximate to the center of the die and the second solder TIM is proximate to an edge of the die, the first solder TIM has a higher indium content than the second solder TIM, and the first solder TIM has a higher thermal conductivity than the second solder TIM.

2. The IC package of claim 1, wherein the second solder TIM includes a perimeter portion.

3. The IC package of claim 2, wherein the first solder TIM is laterally surrounded by the second solder TIM.

4. The IC package of claim 1, wherein the second solder TIM includes one or more corner portions.

5. The IC package of claim 1, wherein the second solder TIM includes one or more edge portions.

6. The IC package of claim 1, further comprising:
sealant between a bottom portion of the lid and the package substrate, and
gaps in the sealant.

7. The IC package of claim 1, wherein the first solder TIM has a lower melting point than the second solder TIM.

8. The IC package of claim 1, wherein the second solder TIM has a higher stiffness than the first solder TIM.

9. An integrated circuit (IC) package, comprising:
a package substrate;
a die; and
a thermal interface material (TIM), wherein the die is between the TIM and the package substrate along a vertical axis, the TIM includes a first TIM and a second TIM, the first TIM and the second TIM are solder TIMs, at least a portion of the first TIM is proximate to a center of the die, the second TIM is proximate to an edge of the die, and the first TIM has a higher indium content than the second TIM.

10. The IC package of claim 9, further comprising:
a lid; and
sealant between the package substrate and a portion of the lid closest to the package substrate.

11. The IC package of claim 10, further comprising:
gaps in the sealant.

12. The IC package of claim 11, wherein the first TIM has a lower melting point than the second TIM.

13. The IC package of claim 9, further comprising:
an interposer, wherein the interposer is between the die and the package substrate.

14. The IC package of claim 9, wherein the first TIM is previously melted in place and the second TIM is not previously melted in place.

15. The IC package of claim 9, wherein the first TIM is a solder TIM and the second TIM is a polymer TIM.

16. The IC package of claim 9, wherein the second TIM includes a perimeter portion.

17. The IC package of claim 16, wherein the first TIM is laterally surrounded by the second TIM.

18. The IC package of claim 9, wherein the second TIM includes one or more corner portions.

19. The IC package of claim 9, wherein the second TIM includes one or more edge portions.

20. The IC package of claim 9, wherein the first TIM has a higher thermal conductivity than the second TIM.

21. The IC package of claim 9, wherein the second TIM has a higher stiffness than the first TIM.

22. The IC package of claim 9, wherein the first TIM and the second TIM are polymer TIMs.

23. The IC package of claim 9, wherein the first TIM has a lower melting point than the second TIM.

24. An integrated circuit (IC) package, comprising:
a package substrate;
a die;
a lid, wherein the die is between the package substrate and the lid along a vertical axis;

sealant between a bottom portion of the lid and the package substrate, wherein the sealant includes gaps; and a thermal interface material (TIM) between the die and the lid, wherein the TIM includes a first TIM and a second TIM, at least a portion of the first TIM is proximate a center of the die, and the second TIM is proximate an edge of the die.

25. The IC package of claim 24, wherein the lid includes copper or aluminum.

26. The IC package of claim 25, wherein the lid includes nickel.

27. The IC package of claim 24, wherein the lid includes a pedestal, and the die is between the pedestal and the package substrate.

28. The IC package of claim 24, wherein the first TIM has a lower melting point than the second TIM.

29. The IC package of claim 24, wherein the first TIM is a solder TIM, and the second TIM is a polymer TIM.

30. The IC package of claim 24, wherein the first TIM and the second TIM are solder TIMs.

* * * * *